(12) United States Patent
Wieser

(10) Patent No.: US 11,804,399 B2
(45) Date of Patent: Oct. 31, 2023

(54) VACUUM CLAMPING DEVICE

(71) Applicant: WITRINS S.R.O., Hovorcovice (CZ)

(72) Inventor: Roman Franz Wieser, Hovorcovice (CZ)

(73) Assignee: WITRINS S.R.O., Hovorcovice (CZ)

( * ) Notice: Subject to any disclaimer, the term of this patent is extended or adjusted under 35 U.S.C. 154(b) by 105 days.

(21) Appl. No.: 17/610,093

(22) PCT Filed: May 5, 2020

(86) PCT No.: PCT/EP2020/062460
§ 371 (c)(1),
(2) Date: Nov. 9, 2021

(87) PCT Pub. No.: WO2020/229233
PCT Pub. Date: Nov. 19, 2020

(65) Prior Publication Data
US 2022/0216091 A1  Jul. 7, 2022

(30) Foreign Application Priority Data
May 10, 2019  (DE) .................. 10 2019 112 318.6

(51) Int. Cl.
*H01L 21/683* (2006.01)
*B25B 11/00* (2006.01)

(52) U.S. Cl.
CPC ........ *H01L 21/6838* (2013.01); *B25B 11/005* (2013.01)

(58) Field of Classification Search
CPC ..... B25B 11/00; B25B 11/005; B25B 11/007; H01L 21/6838; H01L 21/68742; B23Q 3/08; B23Q 3/088

USPC .................. 269/20, 21, 35; 29/559
See application file for complete search history.

(56) References Cited

U.S. PATENT DOCUMENTS

| 5,534,073 A | * | 7/1996 | Kinoshita | ............. C23C 16/481 |
| | | | | 269/21 |
| 6,032,997 A | * | 3/2000 | Elliott | ................... B25B 11/005 |
| | | | | 269/21 |
| 2008/0146124 A1 | | 6/2008 | Morita | |
| 2012/0216396 A1 | | 8/2012 | Rai et al. | |
| 2018/0326590 A1 | * | 11/2018 | Masuda | ................... B25J 15/04 |

FOREIGN PATENT DOCUMENTS

| CN | 104934356 A | 9/2015 |
| DE | 202013100632 U1 | 3/2013 |

OTHER PUBLICATIONS

PCT International Search Report and Written Opinion, PCT/EP2020/062460, dated Aug. 3, 2020, 14 pages.

* cited by examiner

*Primary Examiner* — Lee D Wilson
*Assistant Examiner* — Alberto Saenz
(74) *Attorney, Agent, or Firm* — Quarles & Brady LLP

(57) ABSTRACT

Vacuum clamping device for clamping workpieces, in particular for clamping flat substrates, such as wafers for example, comprising a base plate having a suction surface, wherein a plurality of suction openings are formed in the suction surface of the base plate, wherein the base plate can be connected to at least one negative-pressure device via at least one suction line, characterized in that the suction openings are arranged in a peripheral region of the suction surface of the base plate.

12 Claims, 6 Drawing Sheets

Detail F:

VACUUM CLAMPING DEVICE

CROSS REFERENCE TO RELATED APPLICATIONS

This application is a national stage application of International Patent Application No. PCT/EP2020/062460 filed May 5, 2020, which claims priority to German Patent Application No. 10 2019 112 318.6, filed on May 10, 2019, which application is hereby incorporated by reference in its entirety.

BACKGROUND

This disclosure relates to a vacuum clamping device for clamping workpieces, in particular for clamping flat substrates such as wafers, the vacuum clamping device having a base plate which comprises a suction surface and having a plurality of suction openings which are realized in the suction surface of the base plate, the base plate being connected to at least one vacuum device via at least one suction pipe.

Such vacuum clamping devices are basically already known in the state of the art. Generally, such vacuum clamping devices have a vacuum clamping plate (base plate) which comprises a plurality of suction openings disposed over its surface. Vacuum clamping devices of the above-mentioned type are employed in a broad variety of technical fields.

Such a technical field is, for example, the processing and examination of substrates in the form of wafers. A wafer is basically mostly a circular or square disk on which electronic components are disposed. While such wafers are being processed, they are usually on or in a processing device, which can comprise a processing table, for example. The processing table has a holding unit on which a wafer to be processed is disposed during the processing and against which the wafer is (being) sucked, for example by means of a vacuum.

From DE 20 2013 100 632 U1, a vacuum clamping device is for example known which comprises a vacuum clamping plate having a plurality of suction openings which are uniformly distributed in the suction surface. With this known device, a second vacuum plate is placed onto the vacuum clamping plate. This vacuum plate, which is realized as a sort of mat in the known solution, can fit snugly to the workpiece to be clamped when a vacuum is applied. Hereunto, the vacuum plate has a number of vacuum channels. The vacuum channels are connected to the suction openings in the vacuum clamping plate disposed below the vacuum plate so that the vacuum can be generated at the surface of the workpiece to be clamped.

Wafers do not only need to be processed, but their examination is also an important field of work. For instance, wafers often have to be inspected visually after their production process in order to find and eliminate defects in the production. In this case, the surface of the wafer to be examined has to be examined by means of light. In particular, it is desirable in this visual inspection to be able to examine the wafers both with the aid of reflected light and transmitted light. Before this examination, it is important to "smooth out" a wafer to be examined. This is usually performed with the help of a vacuum clamping device as mentioned above. When using vacuum clamping, it is in particular assumed that outside and inside of a vacuum clamping device, which may be realized as a vacuum table, there is the normal atmospheric pressure, which is usually approximately 1 bar. Now, the wafer to be clamped is placed onto the vacuum clamping device. With the aid of a vacuum unit, for example a vacuum pump, the air inside the vacuum clamping device is sucked off. This generates a pressure difference between the inside and the outside whose boundary layer is the workpiece to be clamped. Consequently, a vacuum is generated between the workpiece, which is in particular a wafer, and the vacuum clamping device. This is in particular a negative pressure which is substantially, i.e., a multiple lower than the ambient pressure, for example the atmospheric pressure. The atmospheric pressure now presses the workpiece against the vacuum clamping device. Now, the upper side of the workpiece which is flat now can be examined without the workpiece being able to slide off during this process.

SUMMARY

The disadvantage of the vacuum clamping devices known from the state of the art is that a visual inspection of the clamped workpiece, which is in particular a wafer, is only insufficiently possible since the suction openings which are realized in the suction surface of the base plate and which are uniformly distributed over the suction surface, hamper a visual inspection or even make a visual inspection impossible. These suction openings generate shadows, for example, which extremely hamper a visual inspection due to reflected light or transmitted light, for example.

One object is overcome the disadvantages of the vacuum clamping devices known from the state of the art. It is in particular an object to provide a vacuum clamping device with which a workpiece, in particular a wafer, can be clamped on the base plate in a flat way on the one hand and be inspected visually in the best possible way on the other hand.

In accordance with the disclosure, this object is attained by a vacuum clamping device of the type mentioned at the beginning which is characterized in that the suction openings are disposed in a periphery region of the suction surface of the base plate. Here, it is particularly desirable that the suction openings are only disposed in a periphery region of the suction surface of the base plate. It has surprisingly proven that it is possible to clamp and "smooth out" wafers in the best possible way with the aid of the inventive vacuum clamping device, even though the suction openings are not uniformly distributed over the suction surface of the base plate, but disposed in a periphery region of the suction surface of the base plate. Due to the fact that the suction openings are located in a periphery region of the suction surface of the base plate, the wafer can almost completely be inspected with the aid of transmitted light since no hampering openings in the form of suction openings in the surface to be inspected are present. Due to this, structures can be inspected with the maximum contrast. Due to the vacuum which is generated between the wafer to be examined and the suction surface of the base plate, the wafer can be pulled onto the base plate in a completely flat way, said base plate being flat, too. This is why the optics require as little depth of sharpness as possible. Due to this, the best possible optical resolution and the best possible light yield are possible in the inspection.

In order to make the best possible visual inspection possible, the base plate is usually transparent and is in particular essentially made of glass or a transparent plastic material, such as Plexiglas.

Advantageously, there is a gap, in particular a gap of approximately 1 to approximately 30 mm, between the suction openings and the edge of the base plate. Due to the fact that the suction openings are disposed at a small distance from the edge of the base plate, an edge section is created between the suction openings and the outermost edge of the base plate, said edge section having a sealing effect towards the outside when a film (described in more detail below) is applied. Therefore, a particularly strong vacuum can be applied between the base plate and the workpiece to be examined.

Advantageously, the suction openings are round. This embodiment is easier to produce and simultaneously has the best possible suction properties.

In a preferred embodiment of the inventive vacuum clamping device, there are suction channels which each adjoin at least two suction openings and extend through the base plate and preferably widen towards the suction surface. With the aid of this embodiment, a particularly strong vacuum can quickly be generated between the base plate and the workpiece.

At least two suction openings usually comprise a connection for a suction pipe and/or are connected to a suction pipe.

The suction openings are preferably disposed on an outline which essentially corresponds to the contour of the object to be clamped. Thus, if the object has a square shape, for example, the suction openings are also disposed in the shape of a square.

If the object to be clamped is a wafer, the suction openings are preferably disposed on an imaginary ring, which is in particular flat in one point, in the suction surface of the base plate, the size of the ring being slightly smaller than the size of the wafer so that the suction openings can only just be covered by the wafer. Due to this ring-shaped arrangement, a particularly high and uniform vacuum can be produced between the base plate of the vacuum clamping device and the wafer to be examined.

Another embodiment of the vacuum clamping device is characterized by a transparent and flexible film which is disposed between the base plate and the workpiece to be clamped and which comprises suction clearances in the region of the periphery of the workpiece. With the aid of such a film, strongly curved workpieces can also be pulled flatly onto the base plate by means of a vacuum which is applied between the film and the workpiece. The film fits snugly against the workpiece when a vacuum is applied and virtually pulls the workpiece onto the base plate of the inventive device when being pulled against the base plate itself. In this manner, a workpiece which is curved more strongly can also be placed in a flat way on the flat base plate. Wafers are often curved (up to 500 µm at the most). Since the above-mentioned film is transparent and only has suction clearances at its periphery, too, an undisturbed visual inspection by means of transmitted light is also possible when such a film is used. When sucking the workpiece onto the base plate, the film initially assumes the shape of the workpiece. After this has happened, an even stronger vacuum is generated between the film and the base plate so that the film is pulled completely onto the base plate, assuming the shape of the table.

Preferably, the above-mentioned flexible film is made of glass. Such a film has proven to be particularly advantageous since it is hardly prone to receive scratches. In contrast to glass films, films from Plexiglas, for example, are prone to receive scratches, which is not advantageous in the case of a visual inspection having a resolution of 1 µm.

Advantageously, the above-mentioned film protrudes beyond the edge of the workpiece and/or of the base plate. This makes it possible to generate a particularly stable vacuum between the film and the base plate and consequently also between the film and the workpiece to be examined.

Further features of the invention are disclosed in the following description of preferred exemplary embodiments of the invention in connection with the drawing and the dependent claims. Here, the individual features can be realized alone or in combination.

BRIEF DESCRIPTION OF THE DRAWINGS

FIG. 4a shows a section along line B-B of the vacuum clamping device of FIG. 3a;

FIG. 6 shows an enlarged detail (detail C) of FIG. 4a;

DETAILED DESCRIPTION

In the following, the same features or those having the same function are marked with the same reference numbers.

Figure 1:
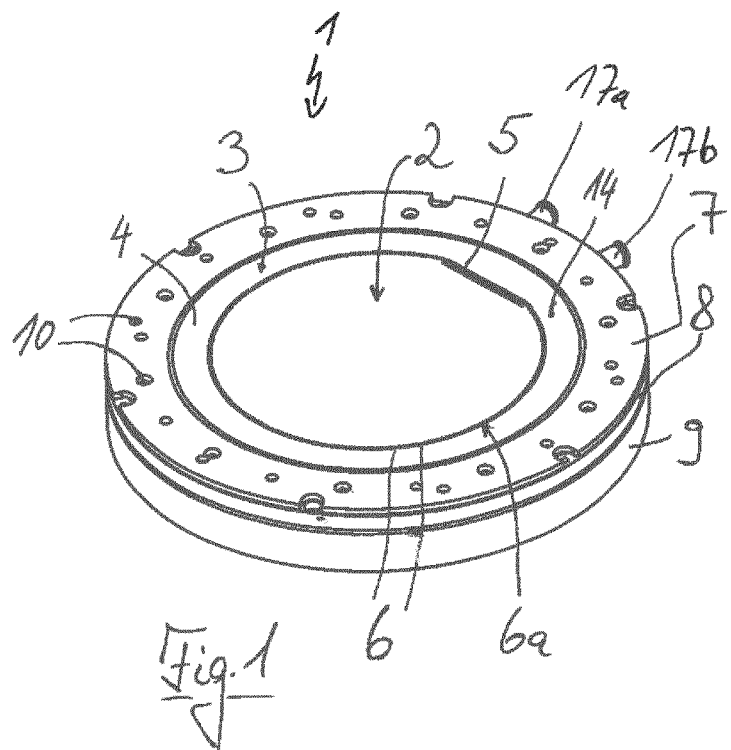
FIG. 1 shows a perspective illustration of an inventive vacuum clamping device.
Figure 2:
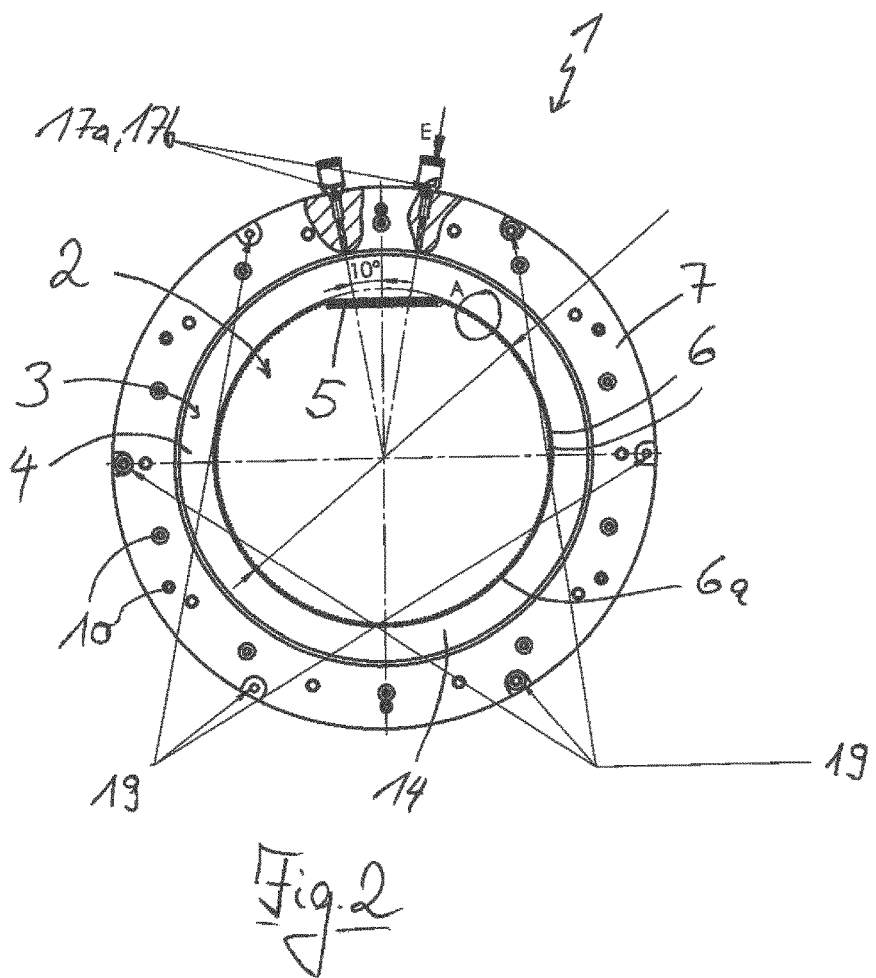
FIG. 2 shows a view from above onto the vacuum clamping device of FIG. 1.
Figure 8:
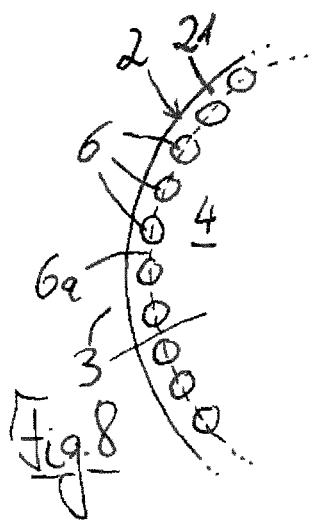
FIG. 8 shows an enlarged detail (detail A) of FIG. 2 in the region of the suction openings.
Figure 9:
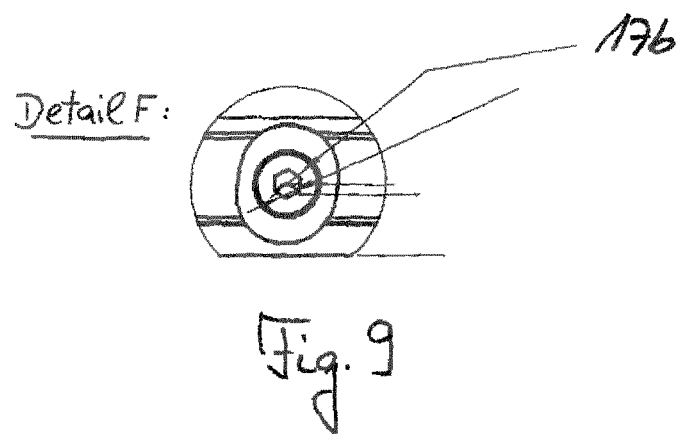
FIG. 9 shows an enlarged illustration of a vacuum connection.

FIGS. 1 and 2 illustrate an inventive vacuum clamping device in the form of a vacuum table 1. A wafer 2 is clamped onto the vacuum table 1, said wafer being supposed to be inspected visually. The vacuum table 1 comprises a base plate 3 which comprises a suction surface 4. The base plate 3 is made of glass. The wafer 2 which rests on the base plate 3 is essentially circular, the wafer 2 being flat in one point 5 in order to be able to grip it more easily. A plurality of suction openings 6 is realized in the suction surface 4 of the base plate 3. The suction openings 6 are disposed on an imaginary ring 6a, which is flat in one point, in the suction surface 4 of the base plate 3. The shape of this imaginary ring 6a corresponds to the shape of the wafer 2, said ring 6a being slightly smaller than the wafer 2 so that the wafer 2 only, just covers the imaginary ring 6a with the suction openings 6. It can easily be seen in FIG. 8 that the suction openings 6 and the wafer 2 are disposed in this way. Here, the wafer is illustrated in a transparent way so that it can be illustrated more easily and so that the suction openings can be seen.

Figure 3A:
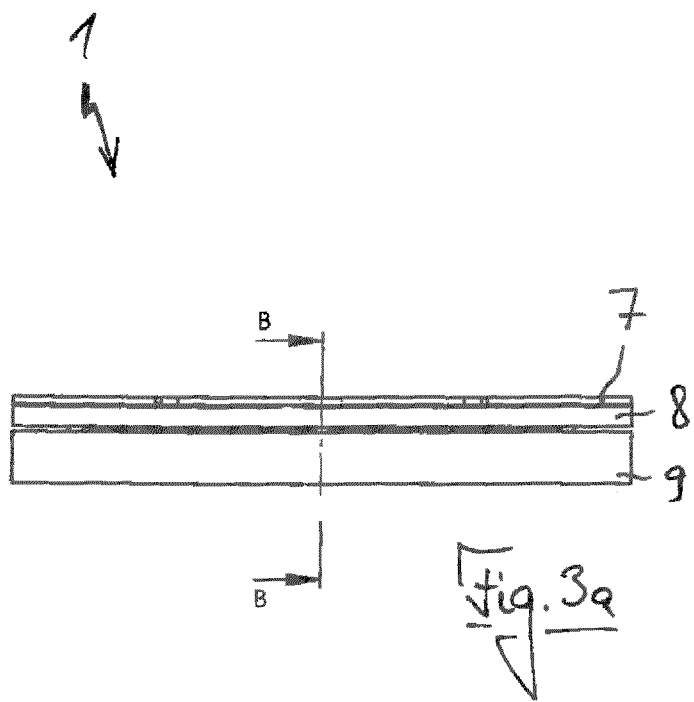
FIG. 3a shows a side view of the vacuum clamping device of FIG. 1 when open.
Figure 3B:
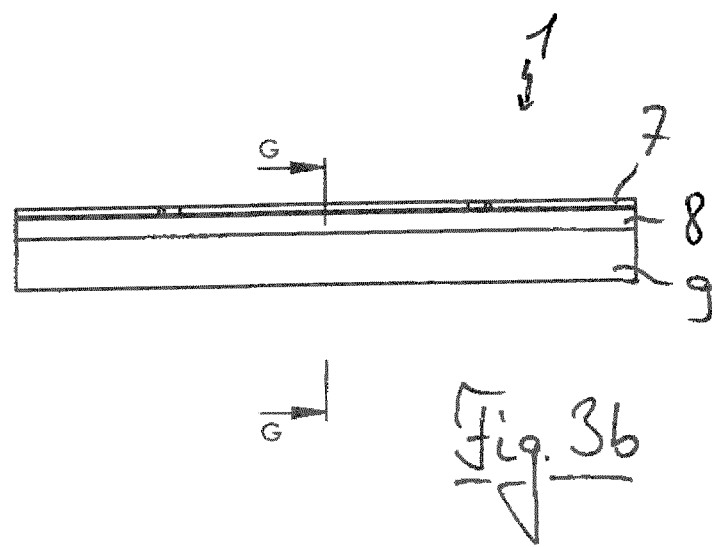
FIG. 3b shows a side view of the vacuum clamping device of FIG. 1 when closed.
Figure 4A:
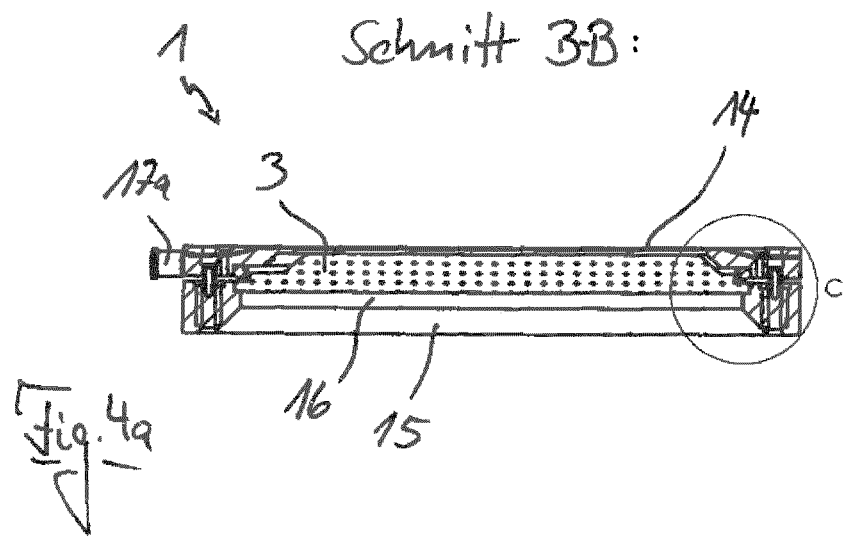
Figure 4B:
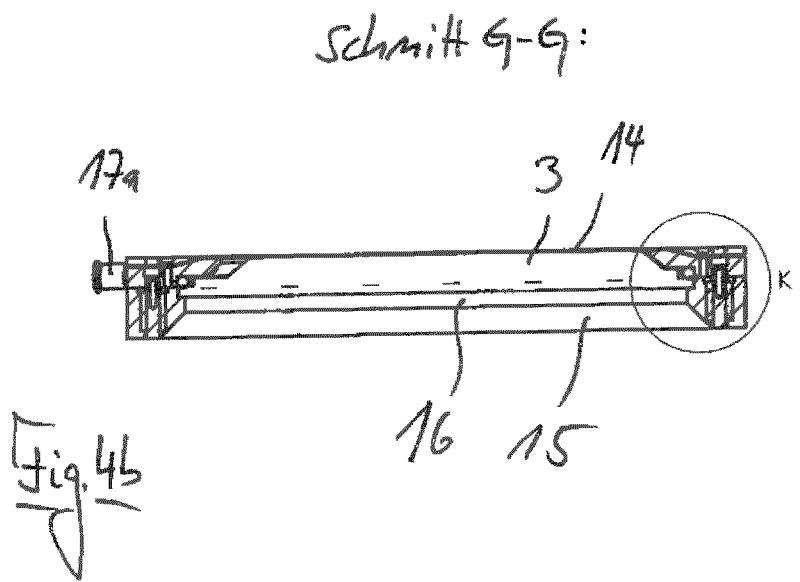
FIG. 4b shows a section along line G-G of the vacuum clamping device of FIG. 3b.
Figure 5:
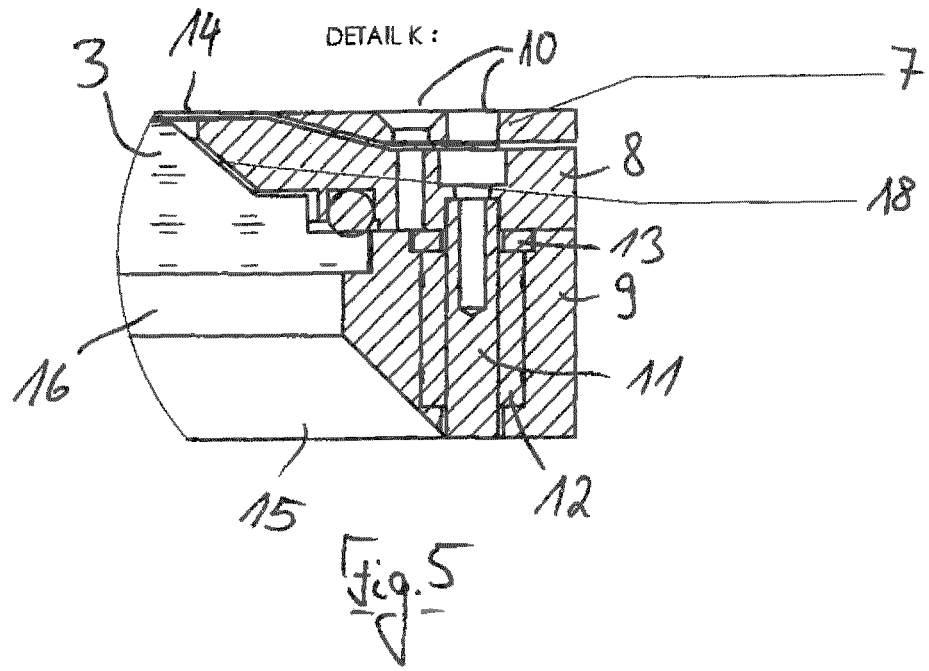
FIG. 5 shows an enlarged detail (detail K) of FIG. 4b.
Figure 6:
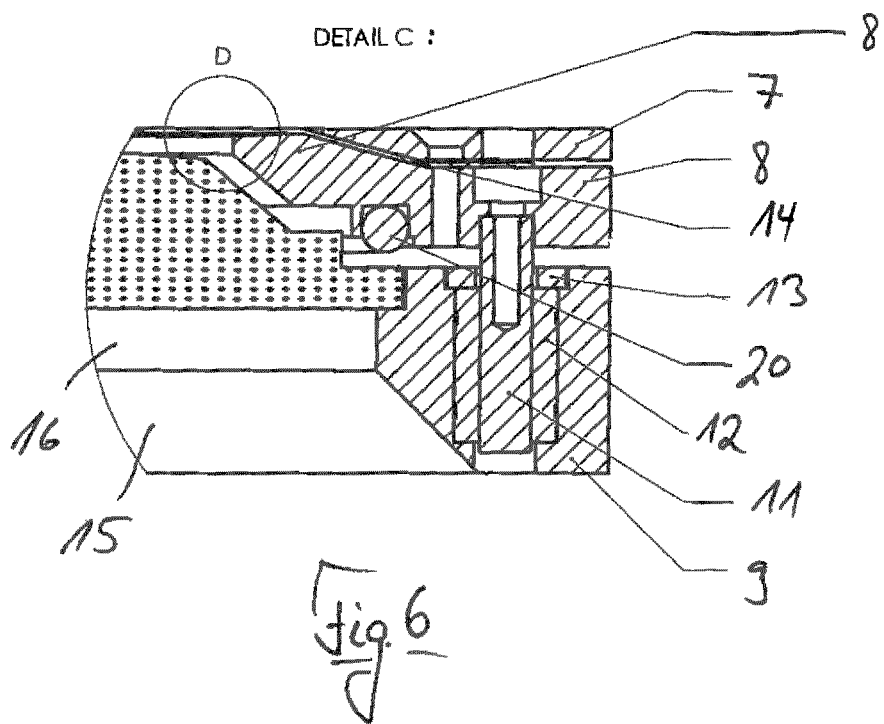
Figure 7:
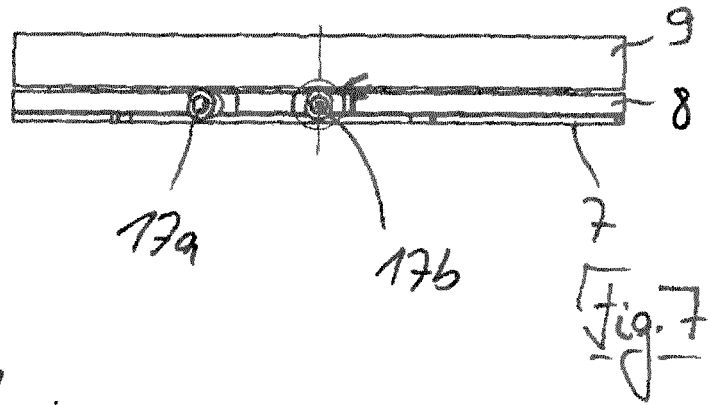
FIG. 7 shows a side view of the vacuum clamping device in accordance with FIG. 1 in the region of vacuum connections.

The vacuum table 1 furthermore comprises an upper ring 7, a holding ring 8 which is connected to the upper ring 7 and which serves to fix the base plate 3, and a lower ring 9. The rings 7, 8 and 9 are made of aluminum and are connected via screw connections. FIGS. 1 and 2 show clearances 10 in the upper ring 7 for introducing fastening screws. Moreover, the upper ring 7 comprises a plurality of indentations 19. These indentations 19 serve to insert adjusting units which provide a certain amount of vertical movability of the rings 7, 8 and 9. For neutralizing a vacuum, the holding ring 8 is lifted slightly. This "open position" is illustrated in FIGS. 3*a*, 4*a* and 6. FIGS. 3*b*, 4*b* and 5 illustrate the "closed position" in which the rings 8 and 9 rest one on top of the other.

The holding ring 8 furthermore comprises an O-ring 20 which ensures the best possible sealing against the outside in the closed position of the vacuum table 1. The lifting mechanism of the vacuum table 1 furthermore comprises a guide rod 11 and a ball lining 12 which is connected to the guide rod 11. A cover 13 is provided at the upper end of the ball lining. These elements can be seen very well in FIGS. 5 and 6.

A flexible glass film 14 is disposed between the base plate 3 and the wafer 2, said glass film 14 comprising suction clearances. The suction clearances of the glass film 14 are disposed in such a way that they are disposed above the suction openings 6 in the suction surface 4 of the base plate 3. The suction clearances in the glass film 14 are thus also disposed on an imaginary ring which is flat in one point. For fixing the glass film 14, it is clamped between the upper ring 7 and the holding ring 8.

On the lower side of the vacuum table 1 (i.e., the side facing away from the base plate 3), the vacuum table 1 is closed off against the outside by a cover plate 15. In the closed position, the cover plate 15 ensures a hermetical sealing of the interior 16 between the base plate 3 and the cover plate 15.

For clamping a wafer, the following steps are performed.

The wafer 2 is initially placed on the base plate 3 with the help of a transport guiding blade (not illustrated) in such a way that the wafer 2 covers all suction openings 6 in the suction surface 4 of the base plate 3. As it has already been mentioned above, the way in which the suction openings 6 are disposed in the base plate 3 corresponds to the shape of the wafer 2, the wafer 2 being slightly larger than the imaginary flat ring 6*a* on which the suction openings 6 are disposed. Due to the fact that the wafer 2 is only slightly larger than the imaginary ring 6*a*, it is achieved that the wafer 2 only protrudes beyond the imaginary ring having the suction openings 6 at a fraction, only a very small section 21 of the wafer 2 protruding beyond the ring 6*a* in this way. In this manner, the production of the wafer requires less material. The glass film 14 is disposed between the wafer 2 and the base plate 3, the suction clearances of said glass film 14 being positioned directly above the suction openings 6 in the base plate 3.

Now, at the latest, the vacuum table 1 is moved from the open position into the closed position by lowering the holding ring 8 onto the lower ring 9.

Figure 10:
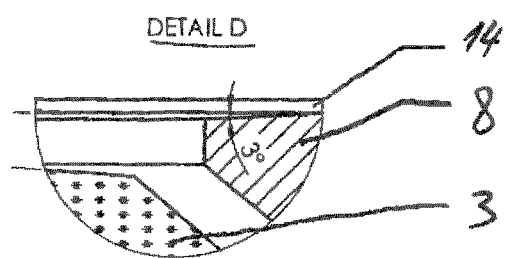
FIG. 10 shows an enlarged detail of FIG. 6.

Since the wafer 2 is not realized in a straight way, but in a slightly curved way, and has to be smoothed out with the help of the vacuum table 1, the glass film 14 and the holding ring 8 draw an angle of approximately 3°. Hereby, an adaptation to the uneven wafer 2 is achieved. In this manner, a sufficient vacuum can be built up faster between the wafer 2 and the glass film 14. The way in which the glass film 14 is disposed can be seen in FIG. 10.

For generating a vacuum, the air is now sucked off from the interior 16 via the vacuum connections 17*a* and 17*b*. At least one of the suction openings 6 is connected to a vacuum channel 18 which in turn has an open connection to one of the vacuum connections 17*a* or 17*b*. Due to the vacuum which is generated, the wafer 2 is initially pulled onto the glass film 14 in the region of the suction opening which is connected to the vacuum channel 18. This is possible particularly easily since the suction clearances in the glass film 14 are positioned directly above the suction openings 6 so that the vacuum can take direct effect onto the wafer 2 in this manner. All suction openings 6 have an open connection. This can be effected for example in that the suction openings 6 pervade the base plate 3 completely from its upper side up to its lower side, thereby being connected in an open way via the interior 16. Due to the fact that the suction openings 6 have an open connection, the vacuum quickly spreads over all suction openings 6 so that the wafer is finally pulled onto the glass film 14 or the base plate 3 via all suction openings 6. The wafer 2 acts as a kind of "lid" only with the aid of which it is possible in the first place to generate a vacuum between the wafer and the base plate 3 or the glass film 14 and to pull the wafer 2 smoothly onto the base plate 3 consequently. In this flat form, the wafer 2 can now be inspected visually in the best possible way. Due to the fact that all of the suction openings 6 are disposed in a periphery region of the base plate 3 and in the outermost edge region of the wafer 2 to be inspected, these suction openings 6 do not hamper a visual inspection of the wafer 2. This is why a visual inspection of the wafer 2—except for the outermost edge region can be performed without any hampering shadows due to suction openings since there are no suction openings within the ring 6*a*. It has also proven that by disposing the suction openings 6 in the outermost edge region of the wafer 2 to be inspected, a particularly strong vacuum can be generated by means of which an uneven wafer can be smoothed out firmly and safely.

In the present exemplary embodiment, the wafer 2 has a diameter of 15 cm. The suction openings have a diameter of 0.5 mm.

The present invention has been described in terms of one or more preferred embodiments, and it should be appreciated that many equivalents, alternatives, variations and modifications, aside from those expressly stated, are possible and within the scope of the invention.

The invention claimed is:

1. A vacuum clamping device for clamping workpieces, in particular for clamping flat substrates, the vacuum clamping device comprising:
   a base plate which comprises a suction surface, a plurality of suction openings being realized in the suction surface of the base plate, the base plate being configured to be connected to at least one vacuum device via at least one suction pipe, wherein the plurality of suction openings are disposed in a periphery region of the suction surface of the base plate; and
   a transparent and flexible film disposed between the base plate and the workpiece to be clamped and which has suction clearances in the region of the periphery of the workpiece.

2. The vacuum clamping device according to claim 1, wherein there is a gap between the plurality of suction openings and an outer edge of the base plate.

3. The vacuum clamping device according to claim 1, wherein the plurality of suction openings are round.

4. The vacuum clamping device according to claim 1, wherein a suction channel adjoins at least one suction opening of the plurality of suction openings, said suction channel extending into the base plate.

5. The vacuum clamping device according to claim 4, wherein the suction channel widens towards the suction surface.

6. The vacuum clamping device according to claim 1, wherein the plurality of suction openings are disposed on an outline, essentially corresponding to a contour of the workpiece to be clamped, in the suction surface of the base plate.

7. The vacuum clamping device according to claim 6, wherein the plurality of suction openings are disposed on the outline, essentially corresponding to the contour of the workpiece to be clamped, in the suction surface of the base plate, on a ring which is flat in one point, the plurality of suction openings being disposed in such a manner that they are configured to be covered with the workpiece to be clamped.

8. The vacuum clamping device according to claim 1, wherein the base plate is transparent.

9. The vacuum clamping device according to claim 8, wherein the base plate is essentially made of glass or a transparent plastic material.

10. The vacuum clamping device according to claim 1, wherein the transparent and flexible film is made of glass.

11. The vacuum clamping device according to claim 1, wherein the transparent and flexible film protrudes beyond an edge of the workpiece and/or of the base plate.

12. The vacuum clamping device according to claim 1, wherein the suction clearances are disposed directly above the suction openings.

\* \* \* \* \*